United States Patent [19]
Kitamoto et al.

[11] Patent Number: 5,889,718
[45] Date of Patent: Mar. 30, 1999

[54] DYNAMIC TYPE SEMICONDUCTOR MEMORY DEVICE

[75] Inventors: Ayako Kitamoto; Masato Matsumiya, both of Kawasaki, Japan

[73] Assignee: Fujitsu Limited, Kanagawa, Japan

[21] Appl. No.: 998,892

[22] Filed: Dec. 29, 1997

[30] Foreign Application Priority Data

Jun. 30, 1997 [JP] Japan .................................. 9-174379

[51] Int. Cl.$^6$ ....................................................... G11C 7/02
[52] U.S. Cl. .......................... 365/210; 365/203; 365/207; 365/208
[58] Field of Search .................................. 365/203, 207, 365/210, 208

[56] References Cited

U.S. PATENT DOCUMENTS

| | | | |
|---|---|---|---|
| 4,421,996 | 12/1983 | Chuang et al. ......................... | 307/530 |
| 4,751,681 | 6/1988 | Hashimoto .............................. | 365/207 |
| 5,424,977 | 6/1995 | Rountree ................................. | 365/149 |

*Primary Examiner*—David Nelms
*Assistant Examiner*—Hien Nguyen
*Attorney, Agent, or Firm*—Nikaido, Marmelstein, Murray & Oram LLP

[57] ABSTRACT

A dynamic type semiconductor memory device includes a sense amplifier connected between complementary bit lines on which memory cells are connected, dummy cells each connected on at least one bit line and having a charge accumulation node or a node, at which charge is accumulated, to be linked to the bit line when selected, and a circuit for controlling the potential at a charge accumulation node in a dummy cell during a precharge period during which the complementary bit lines are precharged, so that the potential at the bit line will be set to a given potential. The given potential is set to a potential lower than an intermediate potential of the potential at a high-potential power supply and the potential at a low-potential power supply attained when a potential difference between the complementary bit lines is amplified by the sense amplifier. Owing to this configuration, an increase in area and an increase in power consumption can be suppressed. The potential at a bit line can be changed by a necessary and sufficient magnitude by merely giving relatively simple control. A margin to be maintained for reading data represented by a high-level signal can be expanded.

15 Claims, 16 Drawing Sheets

Fig.16
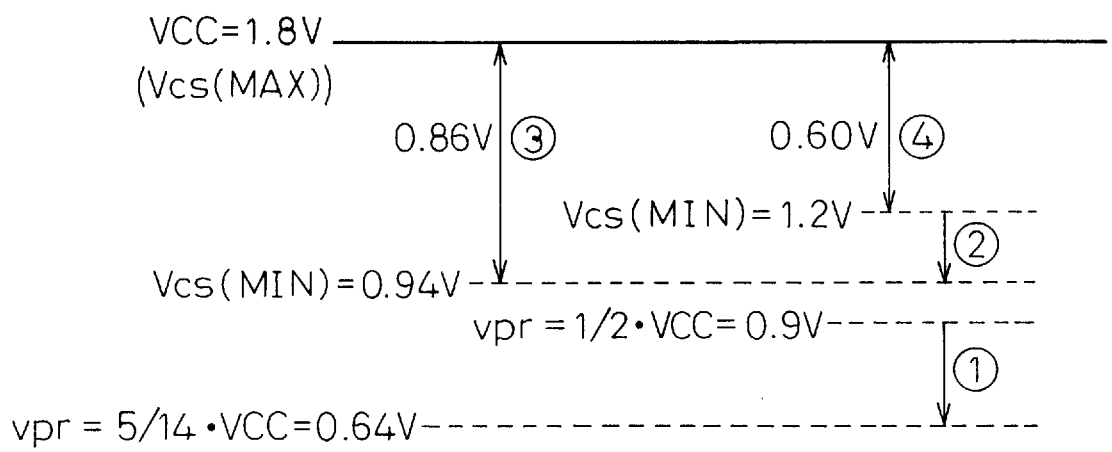
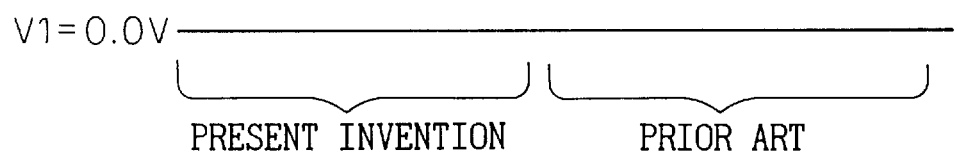

DYNAMIC TYPE SEMICONDUCTOR MEMORY DEVICE

BACKGROUND OF THE INVENTION

1. Field of the Invention

The present invention relates to a dynamic-type semiconductor memory device (hereinafter referred to as a "DRAM") and, more particularly, to an art helpful in expanding a margin to be maintained for reading data from cells.

2. Description of the Related Art

FIG. 1 schematically shows a major portion of a DRAM of a prior art, that is, the circuitry involved in reading data from a cell and ranging from a cell array to a sense amplifier.

In the drawing, there are shown complementary bit lines Bl0 and Bl0X and word lines WL00 and WL01. A dynamic memory cell MS is located at each of intersections between the word lines and bit lines. The memory cell Ms has a one-transistor and one-capacitor structure and consists of a capacitor Cs for accumulating charge as stored data and an n-channel transistor Qs for transferring charge over the bit line BL0 or BL0X associated with the capacitor. Also shown are a sense amplifier (S/A) 1 connected between the complementary bit lines BL0 and BL0X, and a precharge circuit 2 connected between the complementary bit lines BL0 and BL0X. The sense amplifier 1 includes p-channel transistors Q1 and Q2 and n-channel transistors Q3 and Q4 connected between a high-potential power line SAP and low-potential power line SAN and constituting a flip-flop. The precharge circuit 2 includes n-channel transistors Q5 and Q6 connected in series with each other between the complementary bit lines BL0 and BL0X and an n-channel transistor Q7 connected between the complementary bit lines BL0 and BL0X. A line voltage VPR used for precharging is applied to a node between the transistors Q5 and Q6. The transistors Q5, Q6, and Q7 respond to a precharge signal EQL. Moreover, there are shown n-channel transistors Q11 and Q12 for isolating the sense amplifier 1 from the complementary bit lines BL0 and BL0X, and n-channel transistors Q13 and Q14 for isolating the sense amplifier 1 from complementary bit lines (bit lines shown on the right hand of the drawing). The transistors Q11 and Q12 respond to an isolation control signal IS0, and the transistors Q13 and Q14 respond to an isolation control signal IS1.

In the foregoing circuitry, when the complementary bit lines BL0 and BL0X are precharged, the precharge signal EQL is driven high. All the transistors Q5 to Q7 included in the precharge circuit 2 are therefore turned on. A precharge voltage or a voltage used to precharge the bit lines BL0 and BL0X becomes equal to the line voltage VPR used for precharge. In the past, the precharge voltage has been set to an intermediate potential of the potential at a high-potential power supply (nearly identical to the potential at the line SAP) and the potential at a low-potential power supply (nearly identical to the potential at the line SAN) attained when a potential difference between the bit lines BL0 and BL0X is amplified by the sense amplifier 1.

However, during a standby period during which the transistors Qs in the memory cells MS and the sense amplifier 1 are inactive, that is, a precharge period during which the bit lines BL0 and BL0X are precharged, charges accumulated in the capacitors Cs in the memory cells MS leak out. In a memory cell in which a charge inducing a high-level signal is accumulated, the potential at a charge accumulation node or a node in the memory cell at which charge is accumulated decreases because of leakage. A potential difference from an associated bit line gets smaller due to the decrease. In contrast, in a memory cell in which charge inducing a low-level signal is accumulated, the accumulated charge hardly leaks out and the potential at the charge accumulation node in the memory cell hardly changes. A potential difference from an associated bit line does not get very much smaller.

A potential difference between the complementary bit lines BL0 and BL0X maintained during data reading is dependent on a difference between the potential, which has decreased because of leakage, at the charge accumulation node in a cell at which charge corresponding to a high-level signal is accumulated and a precharge voltage. A margin to be maintained for reading of data represented by a high-level signal gets smaller than that for reading of data represented by a low-level signal. In other words, a difference voltage tends to get smaller during data reading of a high-level signal than that during data reading of a low-level signal, and the margin is therefore smaller.

For expanding the margin to be maintained for data reading of a high-level signal, several methods have been proposed for changing the potential at a bit line during data reading in the past. The proposed methods were, for example, a method using a power supply for generating a third voltage different from an intermediate potential between the potentials at bit lines over which a high-level signal and low-level signals are transmitted, and a method in which a dummy capacitor is used as a coupling capacitor to raise the potential at a bit line (a potential, which has decreased because of leakage, at a bit line over which a high-level signal is transmitted).

However, according to the method using a power supply for generating a third voltage, it is necessary to improve the ability of the power supply to drive a current. This leads to an increased power consumption and the complex circuitry of a power circuit. Moreover, there is a problem that an effort to improve an operating speed is obstructed. On the other hand, the method of using a dummy capacitor makes it necessary to increase the ratio of the area of the capacitor to the area of a semiconductor substrate or to raise a voltage used to drive the capacitor. Thus, there is a problem that the area gets relatively larger or the power consumption increases.

SUMMARY OF THE INVENTION

An object of the present invention is to provide a dynamic type semiconductor memory device (DRAM) capable of suppressing an increase in area and an increase in power consumption by changing the potential at a bit line by a necessary and sufficient magnitude by giving relatively simple control and eventually expanding a margin to be maintained for data reading of a high-level signal.

According to the present invention, there is provided a dynamic type semiconductor memory device which stores electric charges in a memory cell therein and thus retains data, comprising: complementary bit lines to which the memory cells are connected; a sense amplifier connected between the complementary bit lines; dummy cells each connected to at least one of the complementary bit lines and having a charge accumulation node or a node, at which charge is accumulated, to be linked to the bit line when selected; and a control circuit for controlling the potential at a charge accumulation node in a dummy cell during a precharge period during which said complementary bit lines are precharged so that the potential at the bit line will be set to a given potential. Herein, the given potential is set to a potential lower than an intermediate potential of the potential at a high-potential power supply and the potential at a low-potential power supply attained when a potential difference between the complementary bit lines is amplified by said sense amplifier.

According to the configuration of a DRAM of the present invention, the potential at a charge accumulation node in a dummy cell is controlled by a control circuit. A precharge voltage, that is, a voltage used to precharge bit lines is set to a value lower than an intermediate potential of the potential at a high-potential power supply and the one at a low-potential power supply. Thus, a potential difference between the potential, which has decreased because of leakage, at a bit line over which a high-level signal is transmitted and the precharge voltage remains sufficiently large even after leakage of accumulated charge.

In other words, a precharge voltage used to precharge bit lines, and a voltage of a signal representing data to be read from a cell are changed, whereby either data represented by a high-level signal and to be read from a cell in which the potential at a charge accumulation node has decreased because of leakage or data represented by a low-level signal and to be read from a cell in which the potential at a charge accumulation node has hardly changed can be read with a difference voltage of the same level retained. Consequently, a margin to be maintained for data reading of a high-level signal can be expanded accordingly.

Moreover, the precharge voltage used to precharge bit lines is determined depending on the potential at a charge accumulation node in a dummy cell. A power supply for supplying power to the bit lines and a power supply used for precharge can be connected to each other. A circuit for precharging bit lines, which is employed in a conventional DRAM (the precharge circuit 2 in FIG. 1) therefore becomes unnecessary. Consequently, an increase in area can be suppressed.

Furthermore, the dummy cells are activated only during a precharge period, and are inactivated during reading of data from a cell or during a period during which a sense amplifier is active. A capacitive load imposed on the bit lines will therefore not be larger than that in the prior art. In other words, the employment of the dummy cells will not cause a difference voltage to be maintained during data reading to get too small or a power consumption to increase.

BRIEF DESCRIPTION OF THE DRAWINGS

Other objects and features of the present invention will be described hereinafter in detail by way of preferred embodiments with reference to the accompanying drawings, in which:

FIG. 9 is a diagram showing an example of a pattern of connections of dummy cells shown in FIG. 6a or 8a;

FIG. 16 is a diagram showing an example of a storage voltage or a voltage stored in a cell and readable as a high-level signal.

DESCRIPTION OF THE PREFERRED EMBODIMENTS

Figure 2:
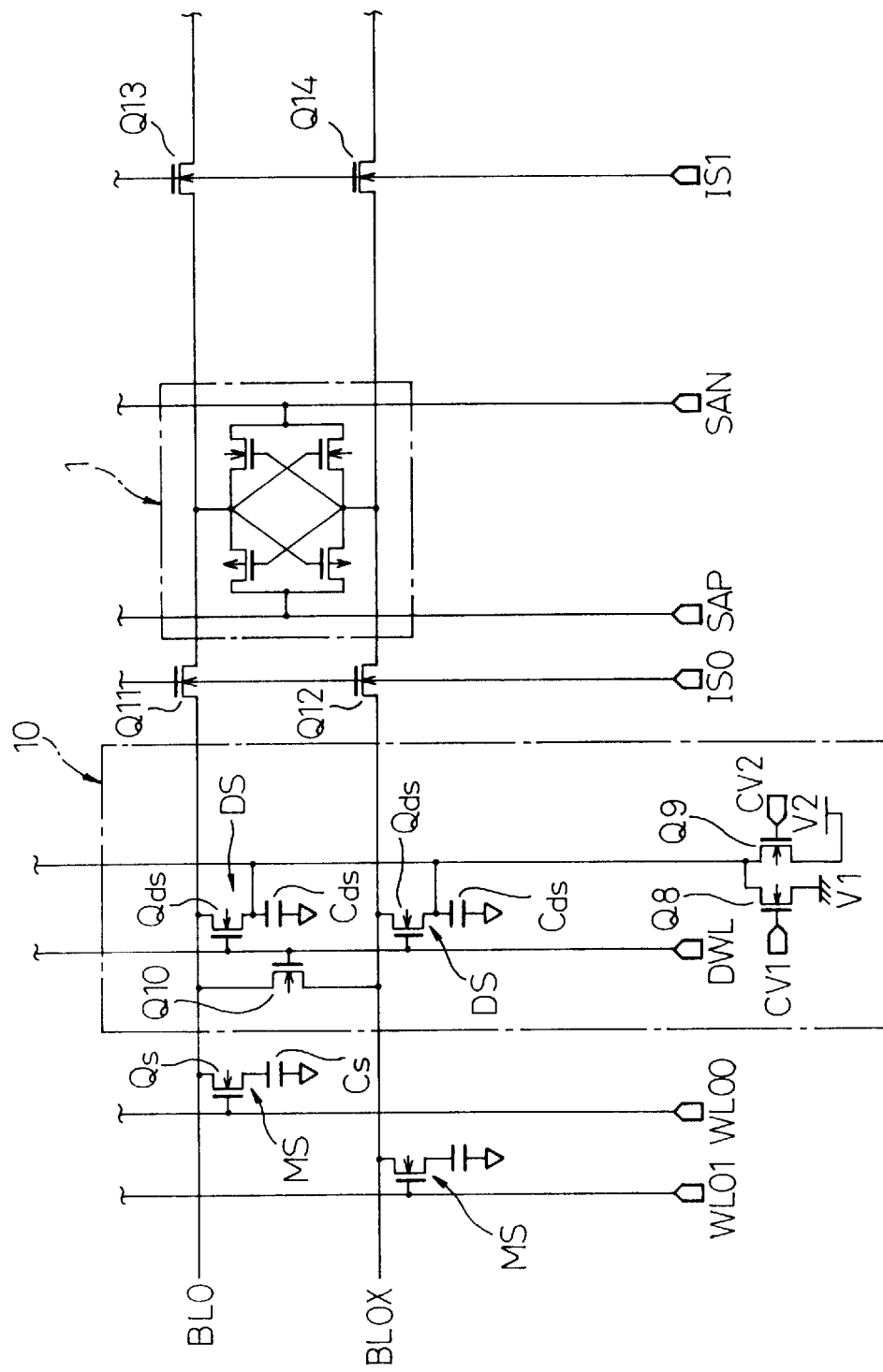
FIG. 2 is a circuit diagram showing the configuration of a major portion of a DRAM in accordance with the first embodiment of the present invention.

FIG. 2 shows the circuitry of a major portion of a DRAM in accordance with the first embodiment of the present invention.

Figure 1:
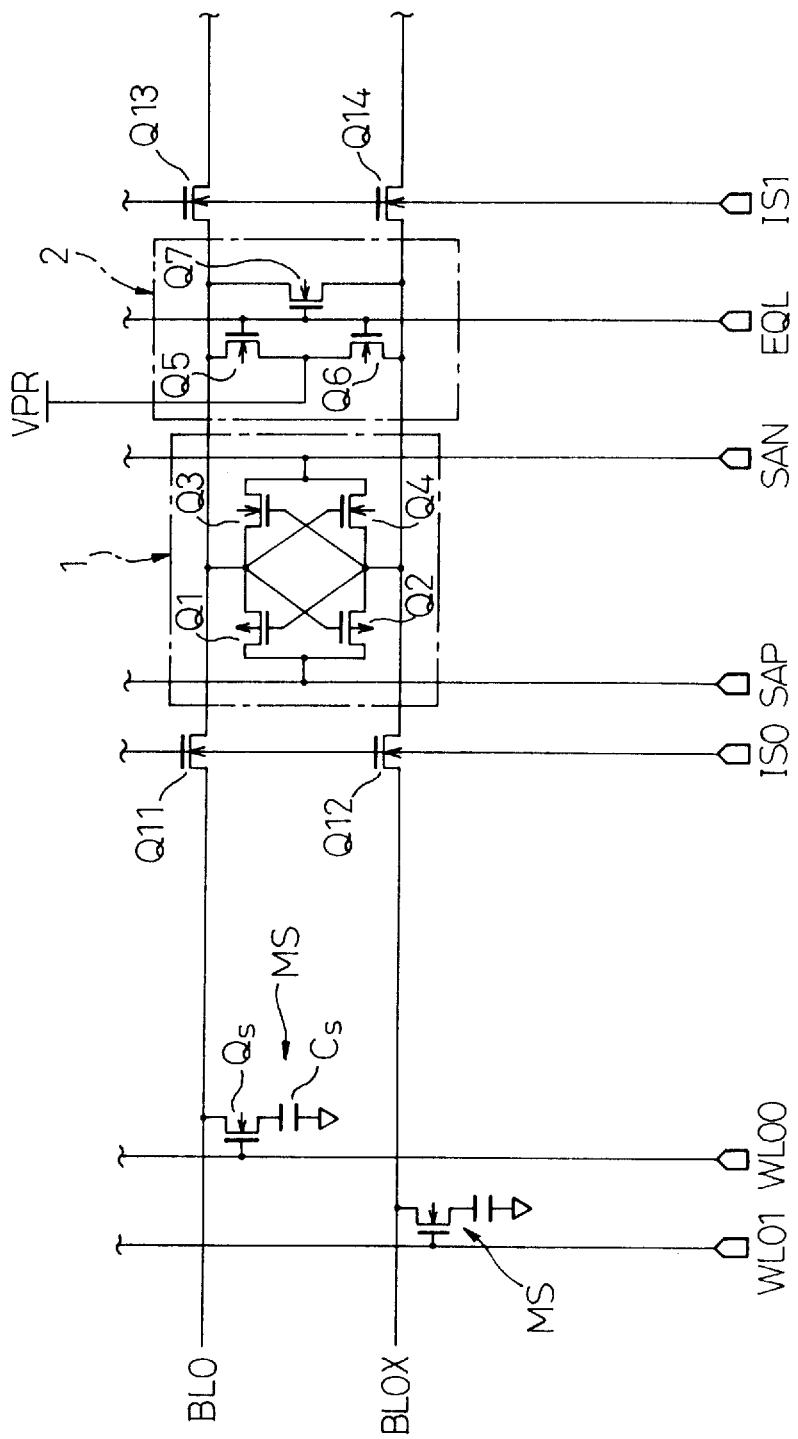
FIG. 1 is a circuit diagram showing the configuration of a major portion of a DRAM in accordance with a prior art.

Reference numerals employed in the illustrated circuitry and identical to those in the circuitry shown in FIG. 1 denote the same circuit elements. The description of the circuit elements will be omitted.

The features of the circuit of this embodiment in terms of the configuration lie in that <1> the precharge circuit 2 employed in the circuit of the prior art (See FIG. 1) is excluded and <2> a circuit block 10 is included as a constituent feature of the present invention.

In the circuit block 10, a dummy cell DS has the same one-transistor and one-capacitor structure as the memory cell MS for storing data. Specifically, the dummy cell DS includes a capacitor Cds in which charge that is a determinant of a precharge voltage or a voltage used for precharge (in the case of the memory cell MS, charge serving as stored data), and an n-channel transistor Qds for transferring charge to or from an associated bit line BL0 or BL0X. Moreover, there are shown an n-channel transistor Q8 for use in connecting a charge accumulation node in each dummy cell DS or a node in each dummy cell at which charge is accumulated (that is, a node between a capacitor Cds and transistor Qds) to a first-potential power supply V1 (0 V in the illustrated example), and an n-channel transistor Q9 for use in connecting the charge accumulation node in each dummy cell DS to a second-potential power supply V2. The transistors Q8 and Q9 are turned on or off in response to a control signal CV1 or CV2 and are controlled so that either of them will be turned on. However, this control includes control to be given to turn off both the transistors Q8 and Q9. Moreover, there are shown a driving signal DWL for use in controlling selection or non-selection of each dummy cell DS (that is, the on-off operation of a transistor Qds), and an n-channel transistor Q10 for strapping complementary bit lines BL0 and BL0X in response to the driving signal DWL.

Note that only a circuit associated with a pair of complementary bit lines BL0 and BL0X is illustrated for brevity's sake. Circuits associated with the other complementary bit lines have the same configuration. That is to say, transistors Q8 and Q9 for controlling the potential at a charge accumulation node in each dummy cell DS so that the potential will be set to a potential V1 or a potential V2. Charge accumulation nodes in dummy cells DS are connected directly to each other with no circuit element between them.

Next, the operations of the circuit in accordance with this embodiment will be described.

At the completion of a period during which a sense amplifier 1 is activated (that is, at the start of a precharge period or a period during which bit lines are precharged), the potentials at the complementary bit lines BL0 and BL0X are equal to the potential (VH) at a high-potential power supply and the one (VL) at a low-potential power supply which are amplified by the sense amplifier 1. At this time, the charge accumulation nodes in the dummy cells DS are charged to the same potential V1 as a first potential and disconnected from both the first-potential power supply V1 and second-potential power supply V2.

In this state, a dummy cell driving signal DWL is activated (that is, driven high) in order to connect the charge accumulation nodes in the dummy cells DS to the complementary bit lines BL0 and BL0X. The potentials at the complementary bit lines BL0 and BL0X are balanced with a potential determined with a potential at each bit line, a capacitance of a dummy cell DS, and a capacitance of each bit line. Assuming that the capacitance of the bit line is Cb1 and the capacitance of the dummy cell DS is Cds, the balanced potentials (vpr) at the bit lines resulting from the connection are expressed as follows:

$$vpr=\{(VH+VL)*Cb1+2Cds*V1\}/\{2(Cb1+Cds)\} \quad (1)$$

Assuming that VL=V1 (=0 V) is established, the expression (1) is rewritten as follows:

$$vpr=VH/2*\{Cb1/(Cb1+Cds)\} \quad (2)$$

Thus, the potential is lower than an intermediate potential (VH/2) of potentials VH and VL.

The complementary bit lines BL0 and BL0X are thus strapped, and the potentials at the complementary bit lines are balanced (agree) with each other. Thereafter, the charge accumulation nodes in the dummy cells DS are connected to the second-potential power supply V2. The complementary bit lines are thus precharged to the potential V2. In this embodiment, the second potential V2 is set to a value near the potential vpr. Consequently, during a period during which the bit lines are precharged, when the potentials at the complementary bit lines BL0 and BL0X are clamped to the second potential V2 (≈vpr), the second-potential power supply is not required to provide the ability to drive a large current but may be required merely to provide the ability to retain the potentials at the complementary bit lines BL0 and BL0X at the potential V2. This contributes to a minimization of power consumption.

Before activation of the sense amplifier 1 starts, the dummy cell driving signal DWL is inactivated (that is, driven low) so that the transistor Q10 and the transistors Qds in the dummy cells DS will be turned off. Thus, the strapping between the complementary bit lines BL0 and BL0X is released and the complementary bit lines are disconnected from the power supply for supplying power used for precharge (that is, the second-potential power supply V2). At this time, the dummy cells DS are disconnected from the associated bit lines. The charge accumulation nodes in the dummy cells DS are connected to the first-potential power supply V1 and thus charged to the potential V1 during a period ending with the start of the next precharge period according to the timing independent of the activation of the sense amplifier 1. During a period during which the sense amplifier 1 is activated, the dummy cells DS are disconnected from the bit lines. A capacitive load imposed on the bit lines will therefore not get larger than the capacitance Cb1. This means that a difference voltage to be maintained during data reading will not get smaller.

Figure 3:
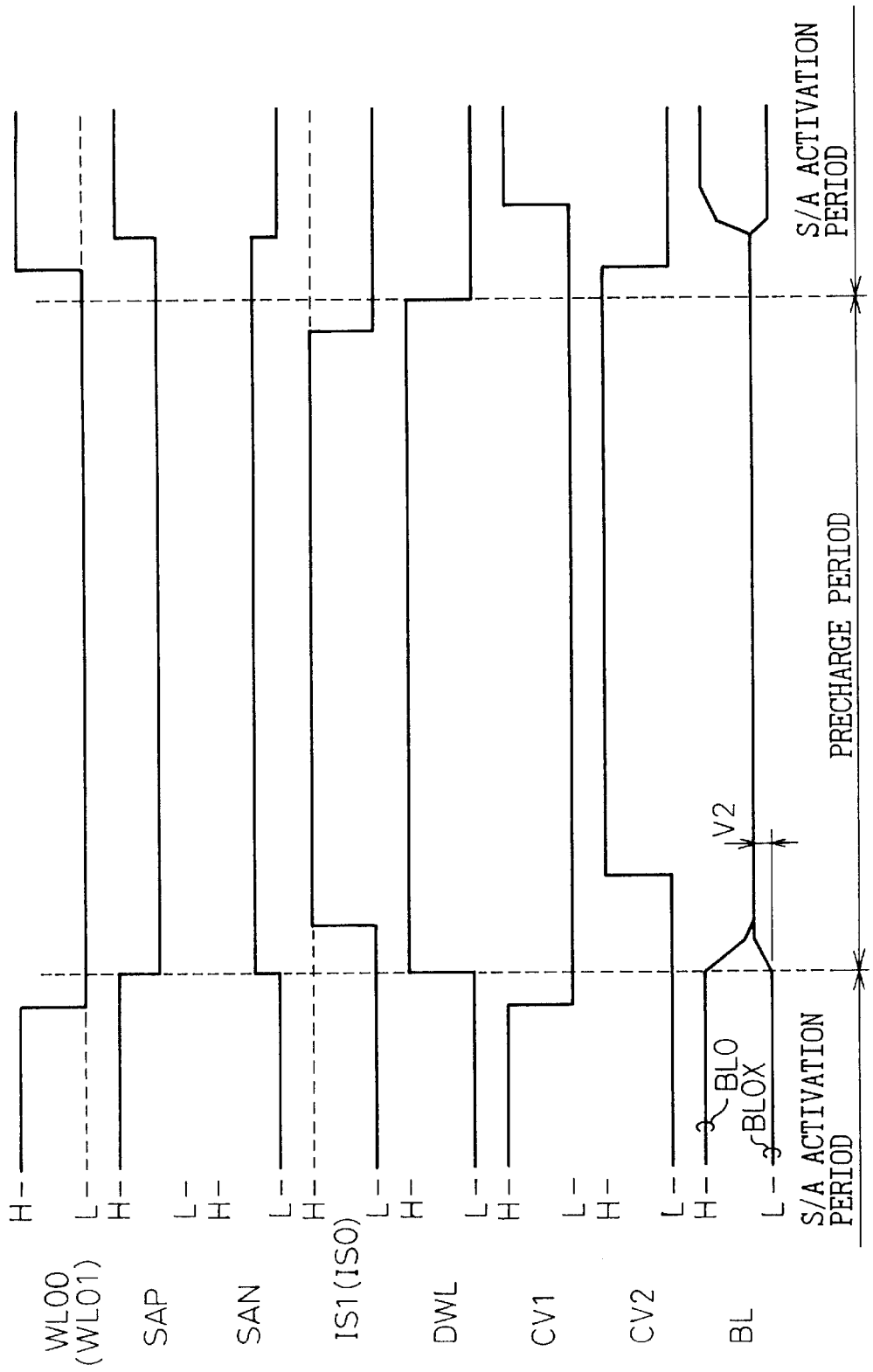
FIG. 3 is a timing chart showing operating wave forms produced in the circuit shown in FIG. 2.

The operations of the circuit of this embodiment will be described with reference to the timing chart of FIG. 3 showing operating wave forms.

Note that the illustration is the timing chart showing operating wave forms produced when a word line WL00 crossing a group of bit lines on the left-hand side of the sense amplifier 1 shown in FIG. 2 is activated. The same applies to operating waves produced when a word line crossing a group of bit lines on the right-hand side of the sense amplifier 1 is activated. Moreover, all unselected word lines (for example, a word line WL01) remain low as indicated with a dashed line in FIG. 3.

First, during a period during which the sense amplifier 1 is activated, the dummy cell driving signal DWL is driven low in order to place the dummy cells DS in an unselected state. The dummy cells DS are therefore disconnected from the associated bit lines. During the period, the control signal CV1 is driven high and the transistor Q8 is turned on. This causes the charge accumulation nodes in the dummy cells DS to be charged to the first potential V1 (=0 V). The control signal CV1 is driven low before the dummy cell driving signal DWL is activated (that is, driven high).

Thereafter, when precharge is started, a selected word line (WL00) is inactivated and the sense amplifier 1 is disconnected from the power lines SAP and SAN. Thereafter, the dummy cell driving signal DWL is activated (driven high). Furthermore, after the potentials at the complementary bit lines BL0 and BL0X are balanced with the aforesaid precharge voltage (vpr), an isolation control signal IS1 is driven high and the transistors Q13 and Q14 are turned on. The sense amplifier 1 is therefore connected to the complementary bit lines on the right-hand side thereof. An isolation control signal IS0 to be applied to transistors on one side (on the left-hand side) of the sense amplifier on which a selected word line is present is high from the beginning as indicated with a dashed line in FIG. 3.

After the potentials at the complementary bit lines on both sides of the sense amplifier 1 are balanced, a control signal CV2 is driven high with the dummy cell driving signal DWL held active. The transistor Q9 is therefore turned on. Consequently, the second-potential power supply V2 is connected to the accumulation charge nodes in the dummy cells DS, and further connected to the bit lines BL0 and BL0X via the transistors Qds in the dummy cells which are on. The potentials at the bit lines are therefore clamped to the precharge voltage V2.

As mentioned above, since the dummy cell driving signal DWL is activated during the precharge period, the complementary bit lines BL0 and BL0X can be strapped and the potentials at the bit lines can be clamped to the precharge voltage.

Furthermore, when the word line WL00 is selected during a period during which the sense amplifier 1 is activated, the control signal IS1 is driven low in order to disconnect the unselected group of bit lines from the sense amplifier 1. The dummy cell driving signal DWL is driven low in order to disconnect the dummy cells DS from the bit lines BL0 and BL0X. Thereafter, the lines WL00, SAP, and SAN are activated successively.

During the same period (that is, the period during which the sense amplifier 1 is activated), the dummy cell driving signal DWL is driven low before the word line WL00 is activated. Thereafter, the control signal CV2 is driven low and the control signal CV1 is driven high. Thus, the charge accumulation nodes in the dummy cells are charged to the potential V1.

As mentioned above, according to the circuitry of the first embodiment, the potentials at charge accumulation nodes in dummy cells DS are controlled in responsive to the on-off operation of the transistors Q8 and Q9. As given by the aforesaid expressions (1) and (2), a precharge voltage or a voltage used to precharge bit lines becomes lower than an intermediate potential (VH/2) of the potential VH at a high-potential power supply and the one VL (=0 V) at a low-potential power supply. Consequently, either data represented by a high-level signal and to be read from a cell in which the potential at a charge accumulation node has decreased because of leakage or data represented by a low-level signal and to be read from a cell in which the potential at a charge accumulation node has hardly changed can be read with a difference voltage of the same level maintained. In short, a margin to be maintained for data reading of a high-level signal can be expanded.

Moreover, in this embodiment, since the circuit for precharging bit lines which has been employed in the prior art (the precharge circuit 2 in FIG. 1) is unnecessary, an increase in area can be suppressed.

Furthermore, during a period during which the sense amplifier 1 is activated, the dummy cells DS are inactivated. A capacitive load imposed on each bit line will therefore not get larger than the capacitance of Cb1. It will therefore not take place that a difference voltage, to be maintained during data reading, becomes smaller or a power consumption increases.

In the aforesaid first embodiment, the circuit block 10 including the dummy cells DS and the transistors Q10 for strapping bit lines is installed on one side of the sense amplifier (in the left-hand side thereof in the illustrated example). Needless to say, the circuit block may be installed on an opposite side (right-hand side) of the sense amplifier 1. Moreover, in the illustrated example, each of the dummy cells DS is connected on each of the bit lines BL0 and BL0X. If necessary, a plurality of dummy cells may be connected on each bit line. Furthermore, the illustrated example is concerned with a shared sense amplifier system (a sense amplifier is shared by complementary bit lines located on both sides of the sense amplifier). The present invention can be adapted to any system other than the shared system.

Figure 4:
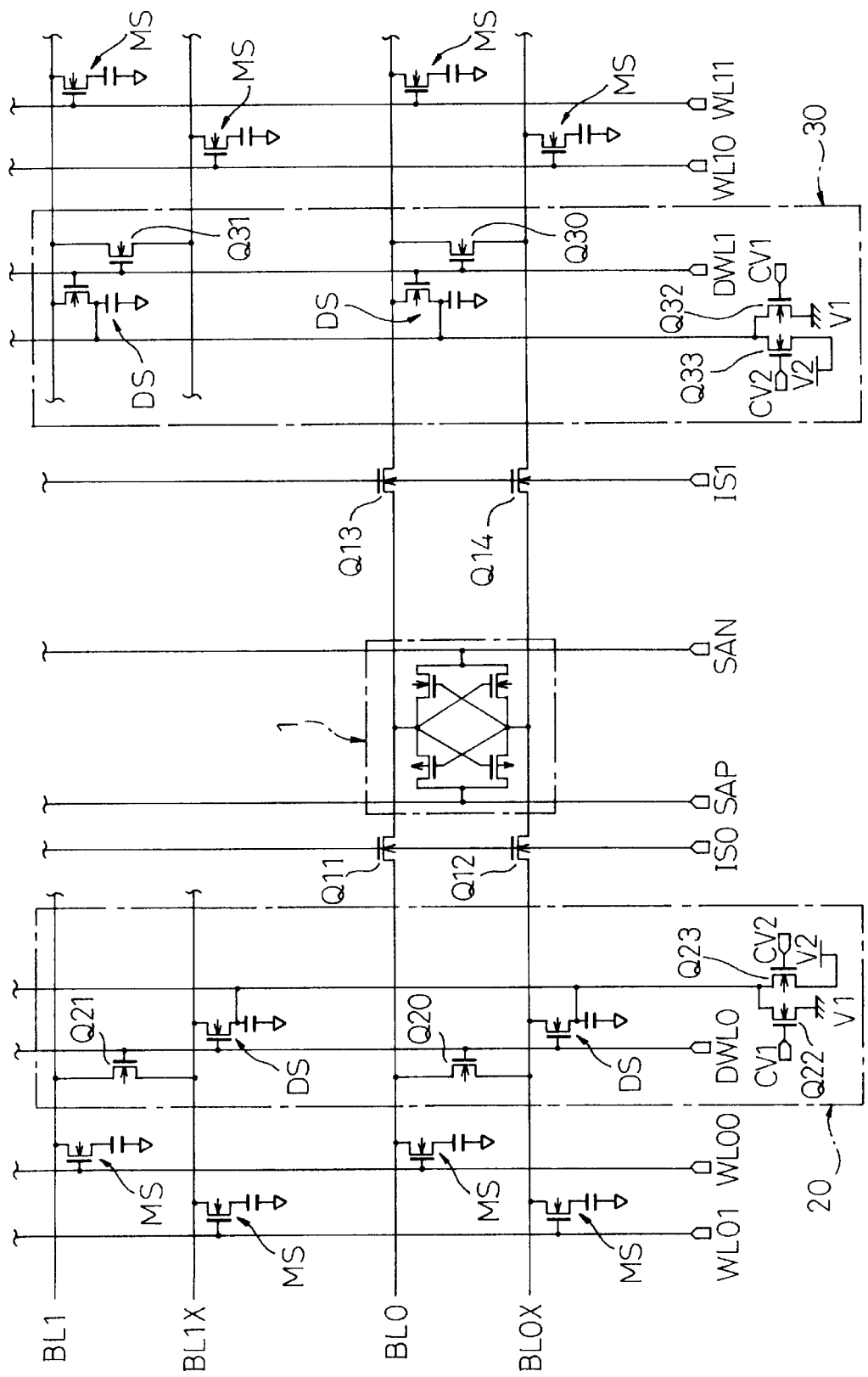
FIG. 4 is a circuit diagram showing the configuration of a major portion of a DRAM in accordance with the second embodiment of the present invention.

FIG. 4 shows the circuitry of a major portion of a DRAM in accordance with the second embodiment of the present invention.

A difference in the circuit of this embodiment from the circuit of the first embodiment shown in FIG. 2 lies in the point that dummy cells DS connected to complementary bit lines BL0 and BL0X are located on opposite sides of the sense amplifier 1 (that is, a dummy cell connected to a bit line BL0X is located on the lefthand side of the sense amplifier 1 and a dummy cell connected to a bit line BL0 is located on the right-hand side thereof). This topology is adopted for the other complementary bit lines BL1 and BL1X. The other circuit elements and operations thereof are identical to those in the first embodiment (See FIG. 2). A description of the circuit elements and operations will be omitted.

Moreover, the configuration and operations of circuit blocks 20 and 30 which are a constituent feature of the present invention are basically identical to the configuration and operations of the circuit block 10 shown in FIG. 2, and will be readily inferred by a person with an ordinary skill in the art. The description of the configuration and operations will therefore be omitted.

The timing chart of FIG. 3 showing operating waves can be adapted to the operations of the circuit of this embodiment.

In the second embodiment, transistors Q20 and Q30 (Q21 and Q31) for strapping bit lines are located on both sides of a sense amplifier 1. Needless to say, the transistors for strapping bit lines may be located on either of the sides of the sense amplifier 1. Moreover, like the aforesaid first embodiment, this embodiment is concerned with the shared sense amplifier system. This embodiment can also be adapted to any system other than the shared system.

Figure 5:
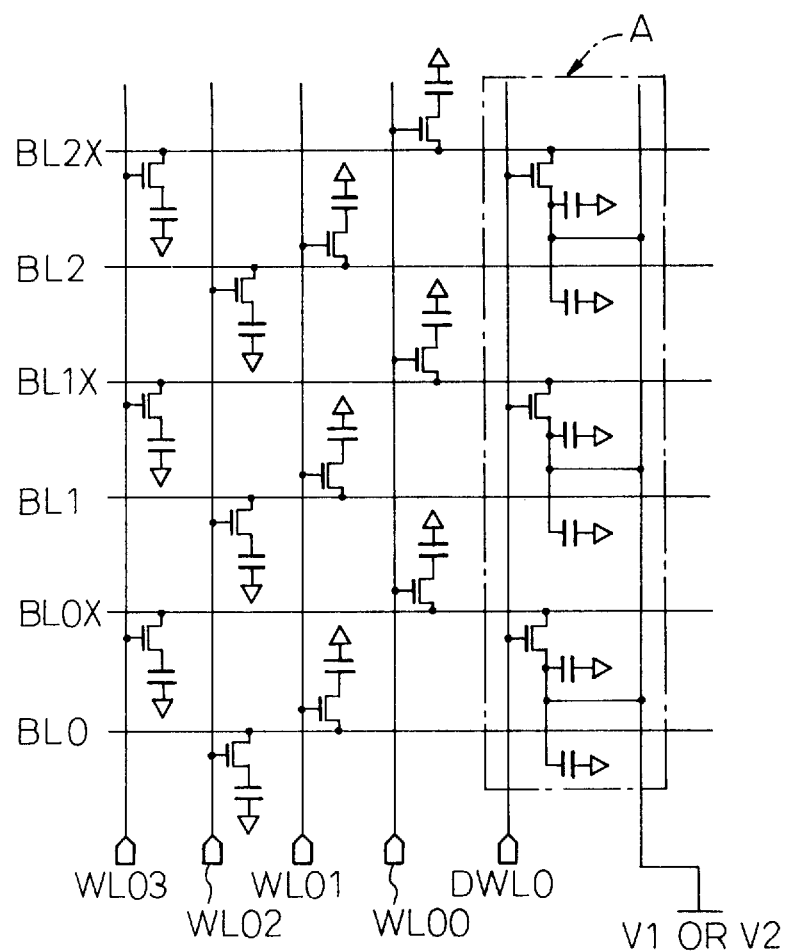
FIG. 5 is a circuit diagram of an equivalent circuit of a first example for realizing dummy cells shown in FIG. 4.
Figure 6:
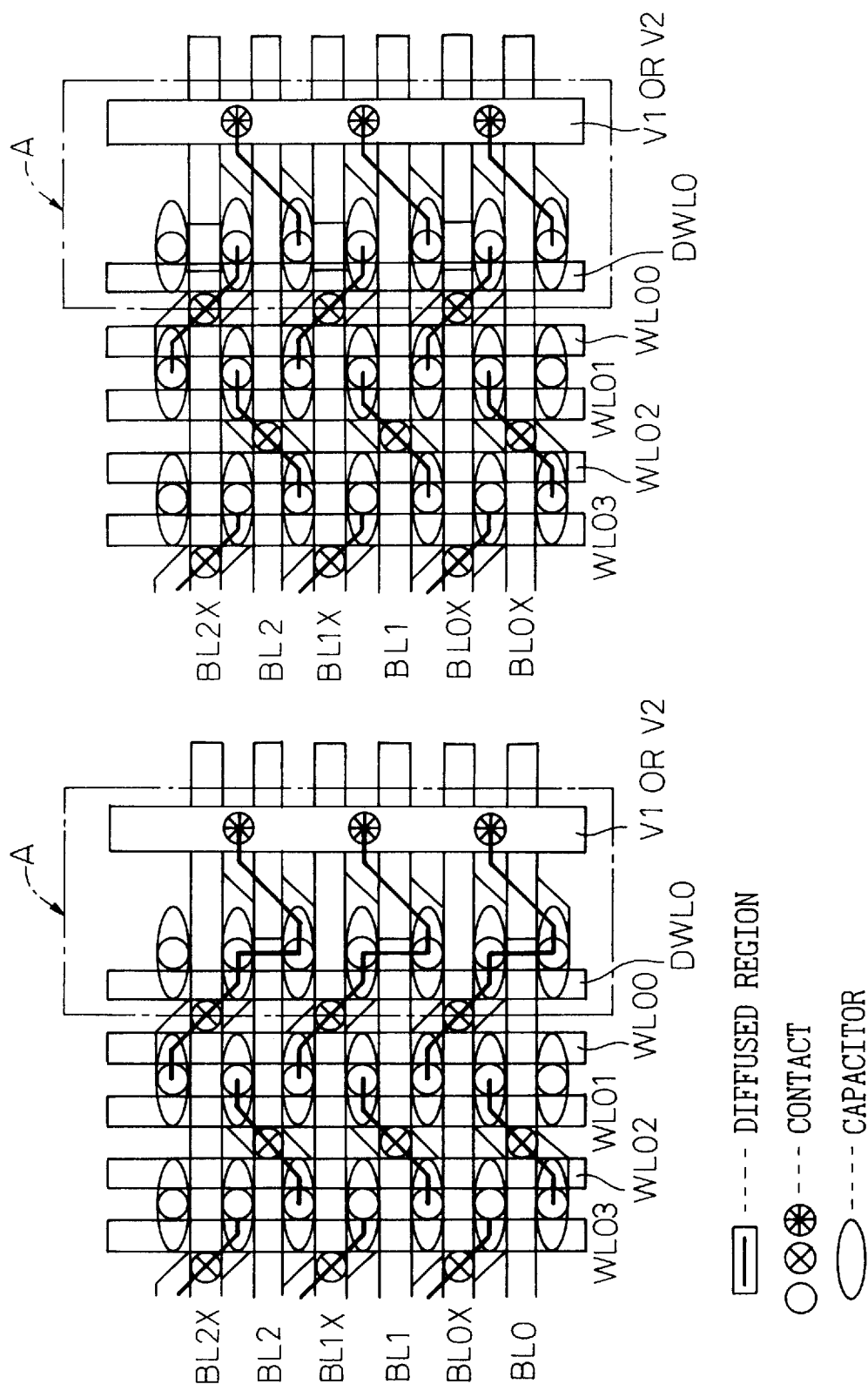
FIGS. 6a and 6b are diagrams showing patterns defining layouts for the equivalent circuit shown in FIG. 5.

FIG. 5 shows an equivalent circuit of a first practical example for realizing the dummy cells in the second embodiment (FIG. 4). FIGS. 6a and 6b show examples of a pattern defining a layout for the equivalent circuit.

The example shown in FIGS. 5, 6a, and 6b is an example of a layout of dummy cells employed when a self-align contact (SAC) process is not adopted. FIG. 6a shows a pattern defining a layout employed when each dummy cell is formed by connecting two normal memory cells and adjoining diffused regions are connected to each other. FIG. 6b shows a pattern defining a layout employed when each dummy cell is formed by connecting two normal memory cells and conductive regions realizing charge accumulation nodes in adjoining cells are connected to each other. Herein, the locations of dummy cells within a portion of a pattern to be repeated many times which contains six bit lines (BL0 to BL2X) and four word lines (WL00 to WL03) are indicated. The dummy cells are each located on an edge of a repetitive pattern according to which cells are repeatedly arranged, that is, at a position near ends of the bit lines within the pattern.

The layout of dummy cells in accordance with this embodiment is characterized in that dummy cells capable of being operated in a desired manner can be formed by merely modifying a portion of a repetitive pattern concerning an extreme end portion of a diffused layer. To be more specific, as shown in FIG. 6a, the pattern is modified so that the extreme end diffused regions are joined with the second end diffused regions, that is, contacts in capacitors and contacts in diffused regions are linked by diffused regions. The contacts in the extreme end diffused regions are connected to power wiring (V1, V2) located on an opposite side of the extreme end diffused regions relative to the capacitors. Moreover, in the case of the pattern defining a layout in which conductive regions forming charge accumulation nodes relative to capacitors in adjoining cells are connected to each other as shown in FIG. 6b, the regularity of the pattern for the diffused layer is maintained to the extreme end portion.

Figure 7:
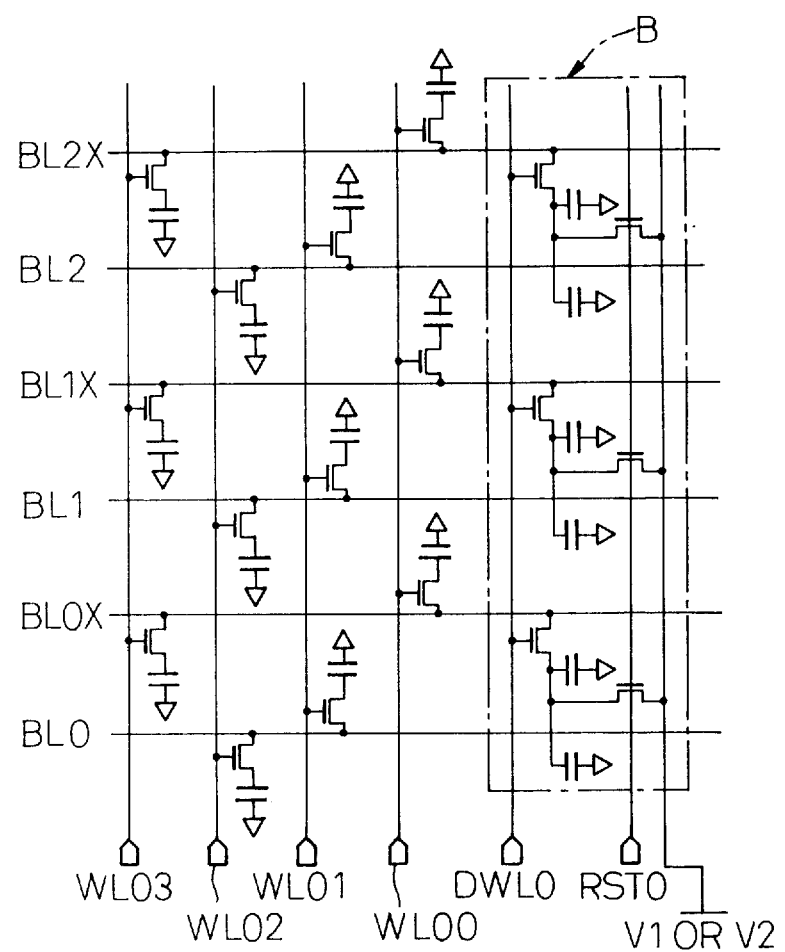
FIG. 7 is a circuit diagram of an equivalent circuit showing a second example for realizing the dummy cells shown in FIG. 4.
Figure 8A:
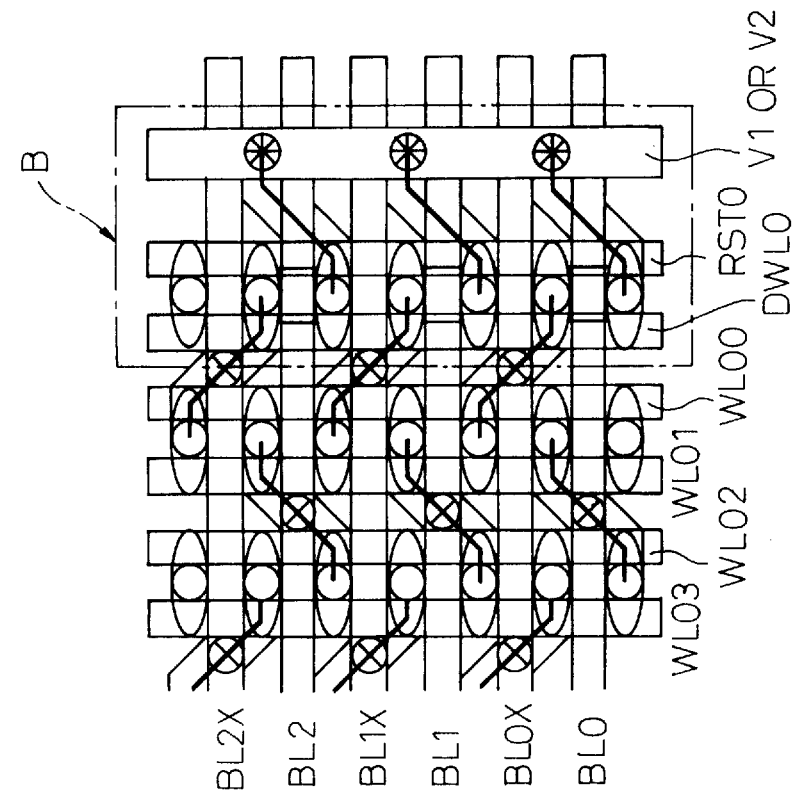
FIGS. 8a and 8b are diagrams showing patterns defining layouts for the equivalent circuit shown in FIG. 7.
Figure 8B:
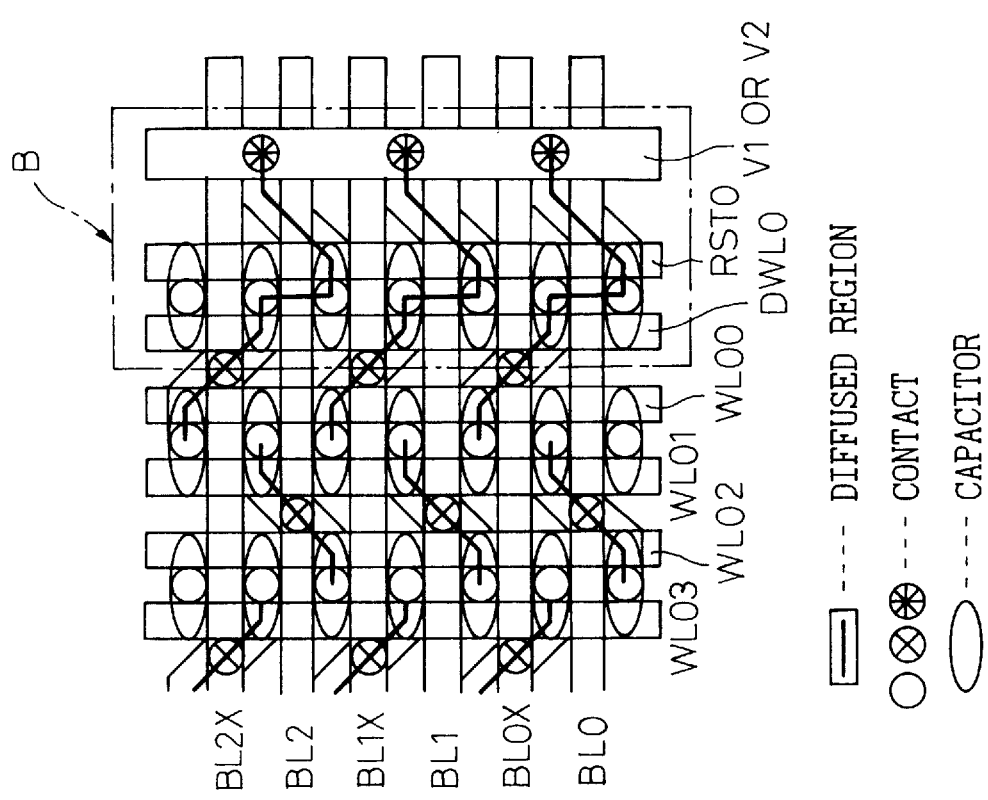

FIG. 7 shows an equivalent circuit or a second practical example realizing dummy cells in the second embodiment (FIG. 4). FIGS. 8a and 8b show examples of patterns defining a layout for the equivalent circuit.

Examples shown in FIGS. 7, 8a, and 8b are examples of layouts of dummy cells employed when the SAC process is adopted. The topologies adopted for the patterns defining the layouts shown in FIGS. 8a and 8b correspond to those of the patterns defining the layouts shown in FIGS. 6a and 6b.

The SAC process shown in FIGS. 7, 8a, and 8b is a process of producing contact holes by carrying out etching within a frame defined by two word lines and two bit lines. When this process is used to produce contacts in capacitors, contacts in capacitors located on the extreme edge must be sandwiched by two word lines. One of the word lines is used as a dummy word line (DWL0), and the other is used as a reset signal line (RST0). The reset signal line (RST0) is not needed for the circuit shown in FIG. 4 to operate but is needed to adopt the SAC process. Since the reset signal line is routed in the same layer as word lines, MOS transistors responding to a reset signal RST0 are, as shown in FIG. 7, formed between charge accumulation nodes in dummy cells and power wiring. For the operations of the circuit of this embodiment, the reset signal RST0 always remains high.

Figure 9:
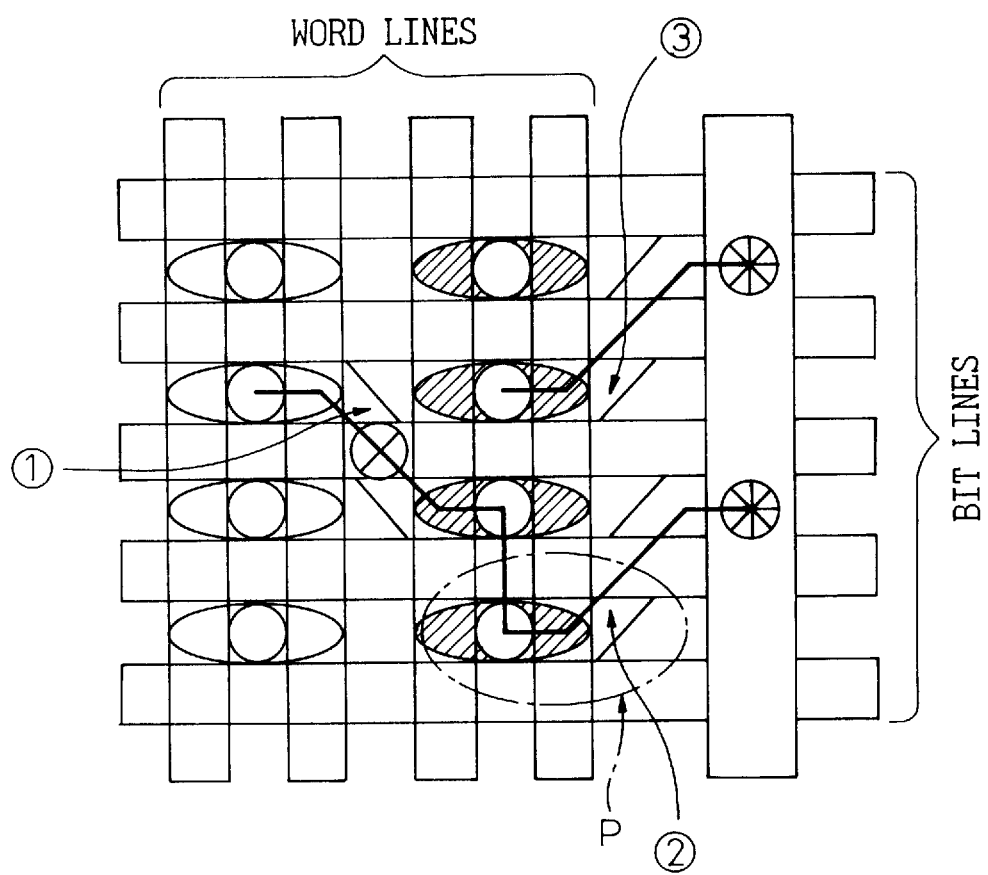
Figure 10:
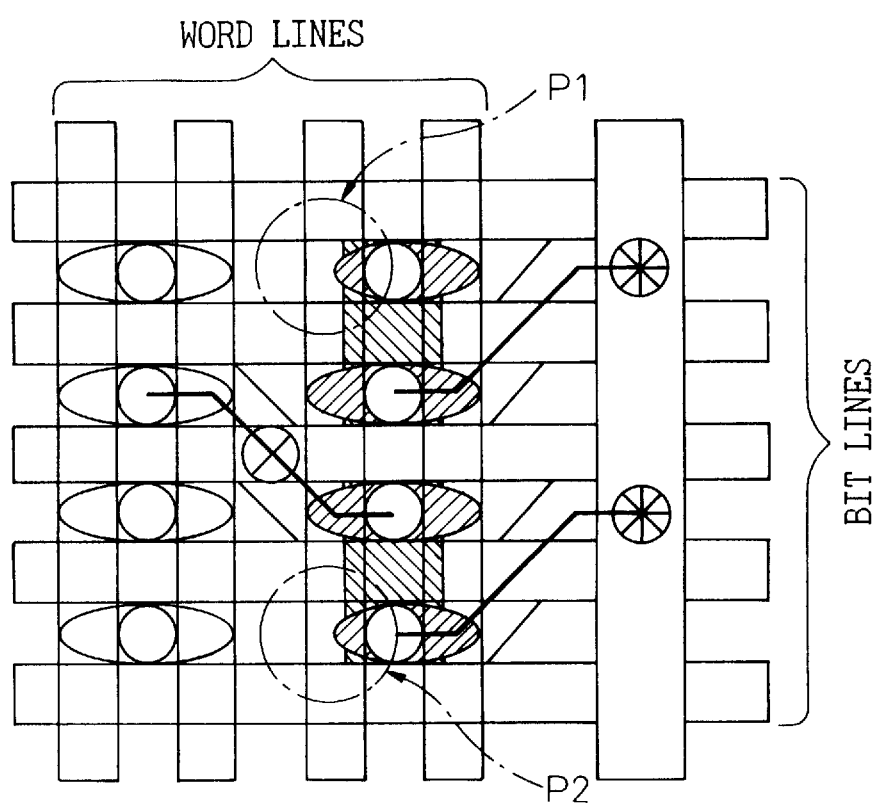
FIG. 10 is a diagram showing an example of a pattern of connections of dummy cells shown in FIG. 6b or 8b.

Next, the topology of dummy cells shown in FIG. 6a or 8a will be described with reference to FIG. 9, and the topology of dummy cells shown in FIG. 6b or 8b will be described with reference to FIG. 10. FIG. 9 shows an example of a pattern employed when each dummy cell is formed by joining two memory cells and adjoining diffused regions are linked. FIG. 10 shows an example of a pattern employed when each dummy cell is formed by joining two memory cells and conductive regions forming charge accumulation nodes relative to capacitors in adjoining cells are linked.

In FIG. 9, as far as a diffused region $\hat{1}$ coming into contact with a certain bit line is concerned, diffused regions $\hat{2}$ and $\hat{3}$ adjoin the diffused region $\hat{1}$. In this case, the diffused region $\hat{1}$ is not linked to the diffused region $\hat{3}$ located far from the contact with the bit line. This is because linking diffused regions results in a shape (indicated with a dot-dash line P in FIG. 9) making it difficult to transfer a pattern clearly by lithography. The pattern may not be transferred faithfully. However, when diffused regions are linked as illustrated, even if a pattern is not transferred faithfully, since the surrounding regions are regions forming nodes to which the same signal is applied, a problem of a short circuit or the like will not occur.

When this kind of pattern defining a layout is created, dummy cells can be formed efficiently in terms of an area. The same can apply to a case in which the shape of a diffused layer is different.

In the case of the pattern of connections shown in FIG. 10, capacitors in cells adjoining in a direction parallel to a bit line may be linked by mistake depending on the conditions for lithography performed at a step of the process. If part of capacitors in cells are deformed as indicated with dot-dash lines P1 and P2, the problem that capacitors in adjoining cells are linked by mistake can be solved.

Figure 11:
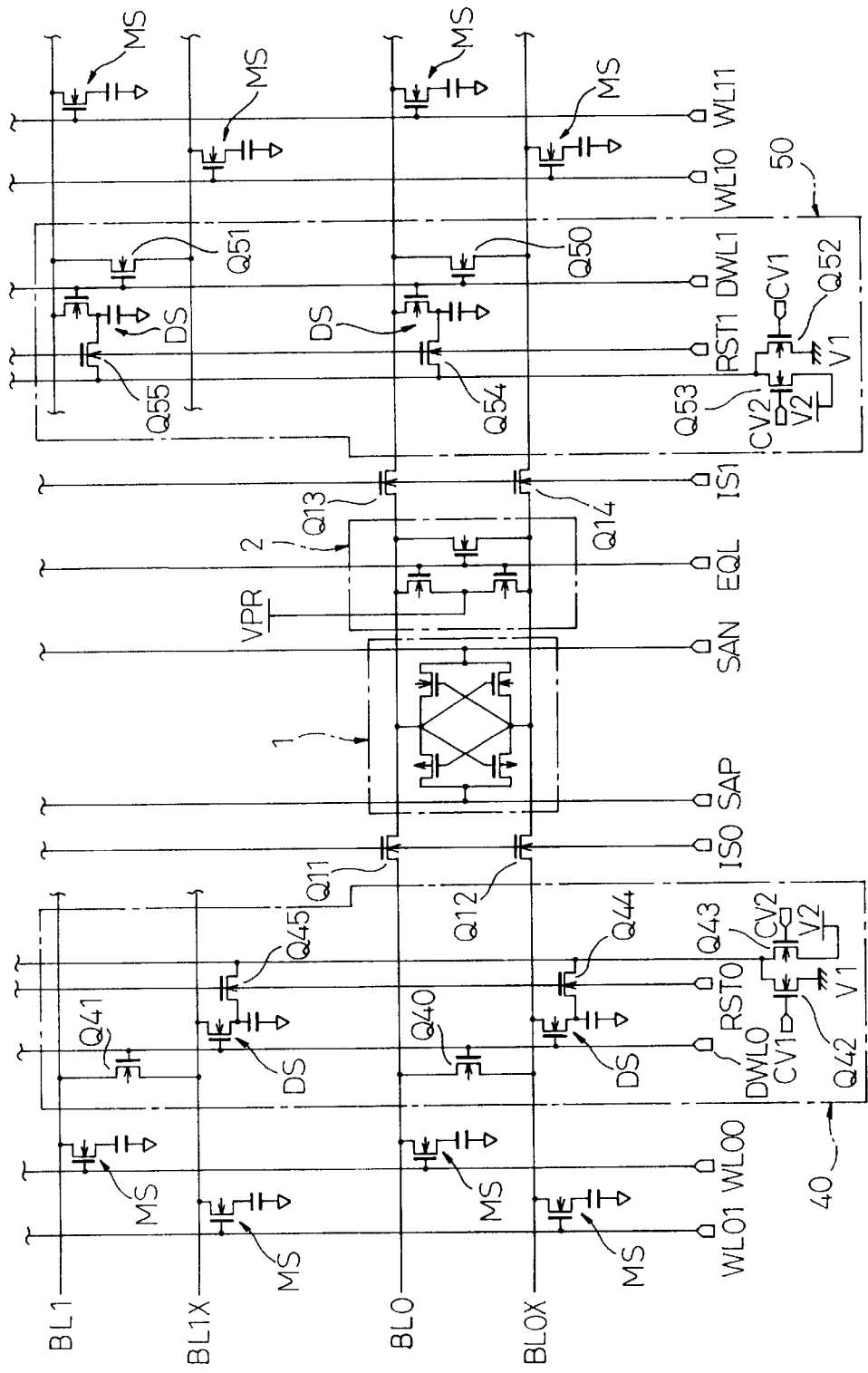
FIG. 11 is a circuit diagram showing the configuration of a DRAM in accordance with the third embodiment of the present invention.

FIG. 11 shows an example of the circuitry of a major portion of a DRAM in accordance with the third embodiment of the present invention.

Differences of the circuit of this embodiment from the circuit of the second embodiment shown in FIG. 4 lie in (1) that charge accumulation nodes in dummy cells DS are connected to each other by n-channel transistors Q44 and Q45 or Q54 and Q55 to be driven with a reset signal RST0 or RST1, and (2) that the precharge circuit 2 employed in the conventional circuit shown in FIG. 1 is included. The other circuit elements and operations thereof are identical to those in the second embodiment (See FIG. 4), and the description of the circuit elements will be omitted.

The circuitry in accordance with this embodiment will prove effective especially when a large wire resistance is imposed on a charge accumulation node in each dummy cell DS. The potentials at complementary bit lines can be clamped swiftly to a given precharge voltage. This is because when wire resistances are large and CR time constants of wirings are large, if the charge accumulation nodes in dummy cells DS are connected to two power supplies (first-potential power supply V1 and second-potential power supply V2) on a time-sharing basis, the potentials at the wirings may not reach to the first and second potentials. To overcome this drawback, the charge accumulation nodes in the dummy cells DS are connected to the first-potential power supply V1 all the time, and reset signals RST0 and RST1 are used to control connections between the charge accumulation nodes and power supplies.

In the third embodiment, two kinds of transistors, that is, a transistor Q40 (Q41, Q50, or Q51) responding to a dummy cell driving signal DWL0 (DWL1) and a transistor Q7 (See FIG. 1) responding to a precharge signal EQL in the precharge circuit 2 are included as transistors for strapping complementary bit lines. Needless to say, either of them may be employed.

Figure 12:
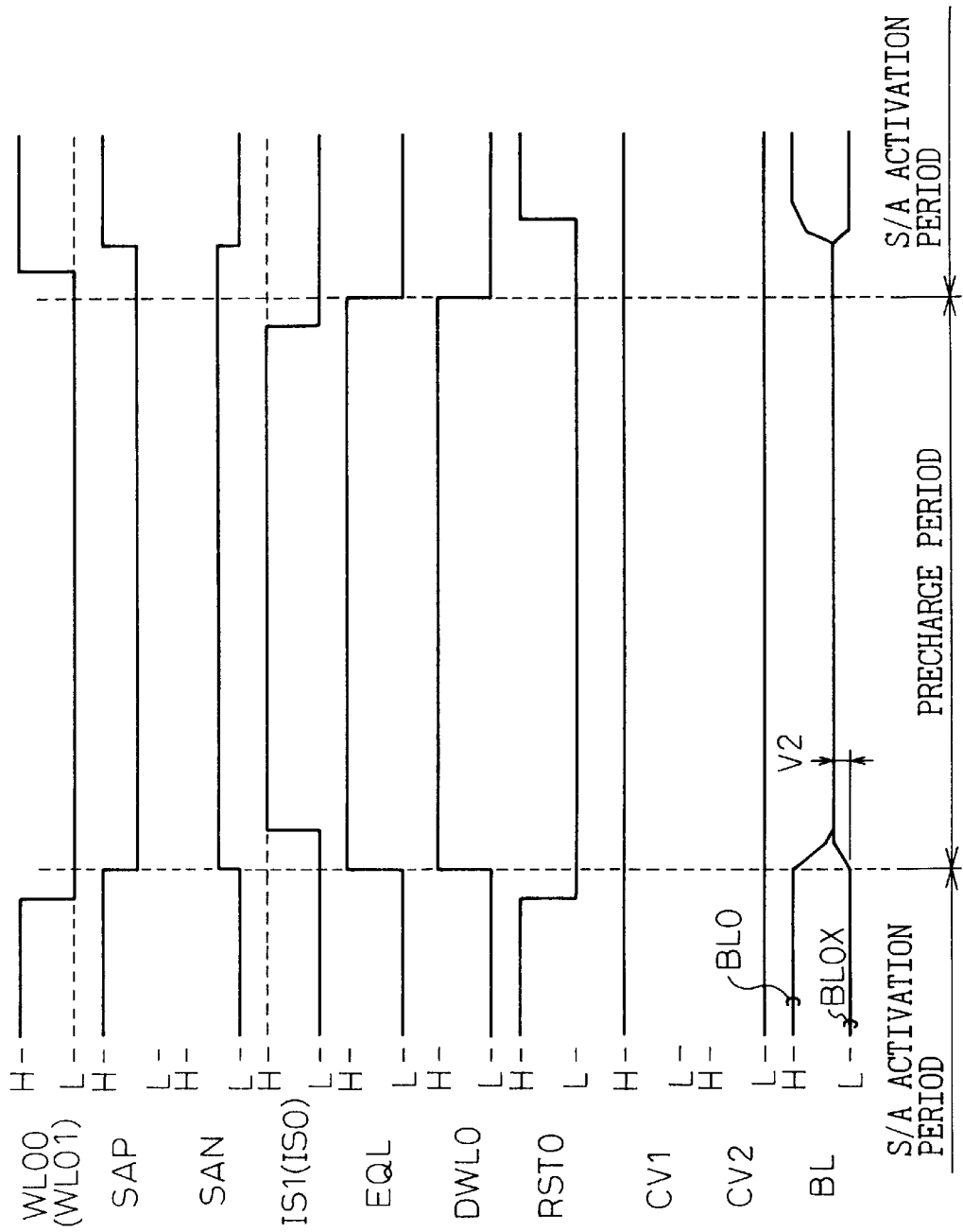
FIG. 12 is a timing chart showing operating wave forms produced in the circuit shown in FIG. 11.

For reference, FIG. 12 is a timing chart showing operating waves produced in the circuit of this embodiment (See FIG. 11). The operations of the circuit will be readily inferred from the timing chart shown in FIG. 3 in relation to the circuit shown in FIG. 2 by a person with an ordinary skill in the art. The description of the operations will be omitted.

Figure 13:
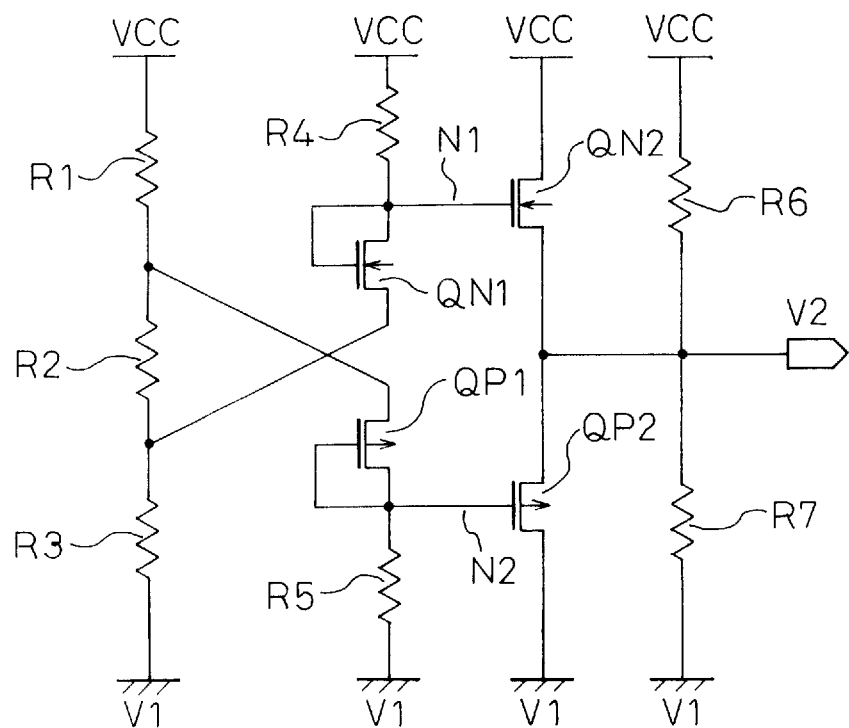
FIG. 13 is a circuit diagram showing an example of the configuration of a V2 voltage generation circuit.

Next, an example of the configuration of a circuit for generating a second supply voltage V2 employed in the aforesaid embodiments will be described with reference to FIG. 13.

In the illustrated circuitry, the resistances of resistors R1, R2, R3, R6, and R7 are set so that a voltage V2 having a desired characteristic can be generated. According to a known VCC/2 precharge system, the resistances are set so that the relationship of R1/R3=R6/R7=1 will be established. By contrast, according to the embodiments of the present invention, bit lines are precharged to a potential lower than a level VCC/2, for example, a level expressed by 5/14*VCC, the resistances are set so that R1/R3=R6/R7=9/5 will be established. Moreover, the resistor R2 connected to be interposed between the resistors R1 and R3 is included for defining a dead band for suppressing a penetration current nearly at the level of a precharge voltage. The width of the dead band is determined by the resistance of the resistor R2. The width of the dead band can be set independently of the precharge voltage. Moreover, the resistors R4 and R5 are included for restricting a current flowing from a power line VCC to a ground V1 by way of an n-channel transistor QN1 and p-channel transistor QP1 that are diode-connected. The resistances of the resistors R4 and R5 are set independently of the precharge voltage. Incidentally, a transistor exhibiting a small ratio of a channel width (W) to a channel length (L) may be substituted for the resistors R4 and R5. An n-channel transistor QN2 and p-channel transistor QP2 are included for supplying or releasing a current so that an output voltage V2 can be retained constant.

The operations of the V2 voltage generation circuit will be described below.

First, a gate voltage N1 of the transistor QN2 and gate voltage N2 of the transistor QP2 are determined depending on what fraction of a voltage is provided due to the presence of the resistors R1 to R3 and how the diode-connected transistors QN1 and QP1 are connected. The gate voltages N1 and N2 are kept nearly constant. A current flowing into the transistors QN2 and QP2 is determined depending on a difference between the output voltage V2 and the gate voltages N1 and N2. For example, when the output voltage V2 decreases, the potential difference between the gate and source of the n-channel transistor QN2 gets larger and the potential difference between the gate and source of the p-channel transistor QP2 gets smaller. A current therefore flows from the power line Vcc to an output terminal V2. This causes the output voltage V2 to rise. By contrast, when the output voltage V2 rises, a potential difference between the gate and source of the n-channel transistor QN2 gets smaller and a potential difference between the gate and source of the p-channel transistor QP2 gets larger. A current therefore flows from the output terminal V2 to the ground V1. This causes the output voltage V2 to fall. Thus, the output voltage V2 having a desired level is compensated for based on the characteristics of transistors.

Finally, advantages provided by the present invention, that is, the reasons why a margin to be maintained for data reading can be made larger than that in a prior art, will be described [HV] with reference to FIGS. 14a to 14c, 15a, 15b, and 16.

As already known, in a DRAM, a charge accumulated in each cell decays time-sequentially because of leakage. The leakage of an accumulated charge and the accurate and reliable reading of data have a contradictory relationship. The present invention can provide the merit that a margin enabling the accurate and reliably reading of data can be expanded.

The leakage of charge accumulated in a cell is thought to occur through an pn junction, a sub threshold element, or a space between a capacitor in a cell and a plate of the cell. The most dominant is the leakage through a pn junction.

Figure 14A:
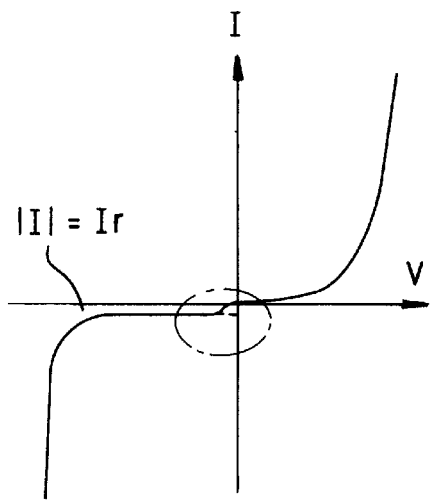
FIGS. 14a to 14c are explanatory diagrams concerning leakage through a pn junction.
Figures 1, 14A:
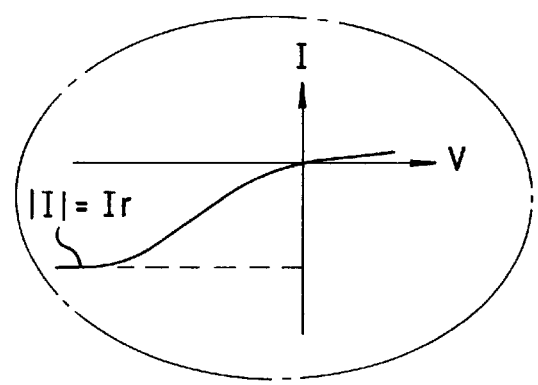
Figure 14B:
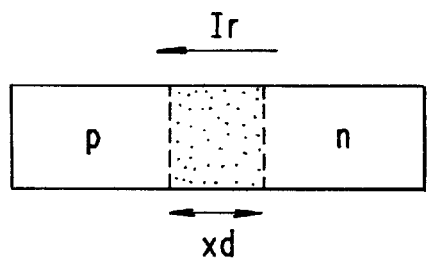
Figure 14C:
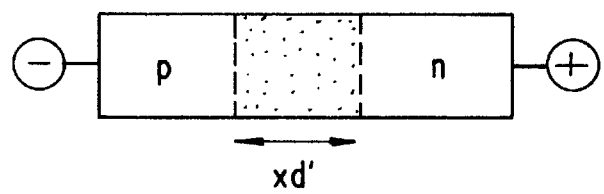

The leakage through a pn junction will be described with reference to FIGS. 14a to 14c. FIG. 14a shows a general characteristic curve of a voltage versus current (V-to-I) observed at an pn junction. FIGS. 14b and 14c show models of the pn junction. A microscopic current flowing in relation to a domain of V<0 is referred to as a reverse current. Herein, an absolute value of the reverse current shall be denoted by Ir. The potential at a p-type semiconductor and that at an n-type semiconductor are different from each other. When the semiconductors are joined, a depletion layer is created on the border (junction) between them. The distribution of potentials becomes balanced (FIG. 14b). The p-type semiconductor is then biased negatively, while the n-type semiconductor is biased positively (that is, reversely biased). The larger the bias is, the larger the width of the depletion layer becomes (See FIG. 14c) (xd to xd'). The reverse current Ir flowing from the n-type semiconductor to p-type semiconductor through the pn junction is given by the expression (3) below.

$$Ir = (A * xd + B) * S \quad (3)$$

where xd is the width of a depletion layer, A and B are constants determined by materials made into the n-type semiconductor and p-type semiconductor, and S is a sectional area of a pn junction. As seen from the expression (3), the reverse current Ir increases as the width xd of the depletion layer gets larger. In other words, the larger the reverse bias is, the larger the reverse current Ir is.

Next, the structure of a cell and the relationship thereof to a pn junction will be discussed.

Figure 15A:
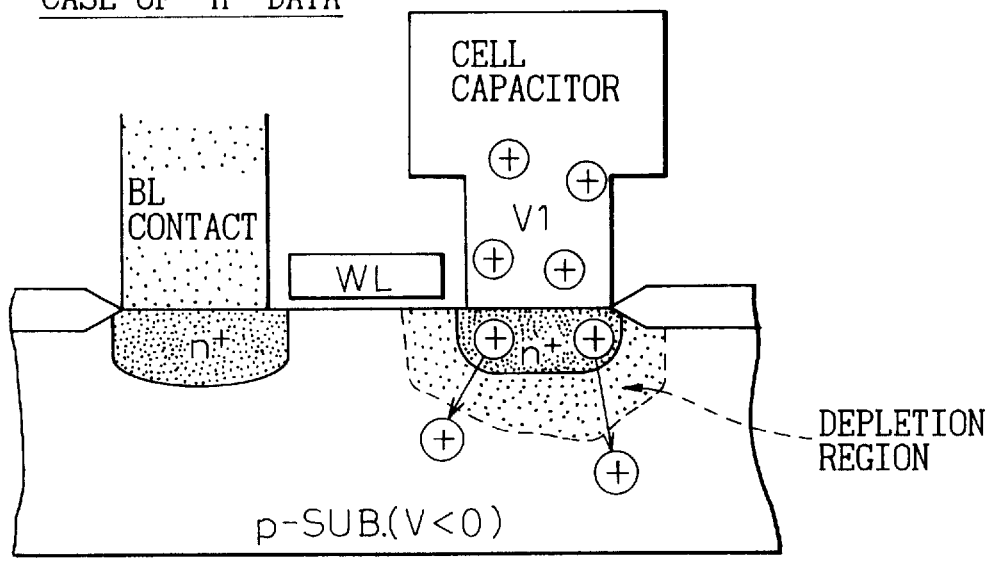
FIGS. 15a and 15b are diagrams showing models of a cell structure.
Figure 15B:
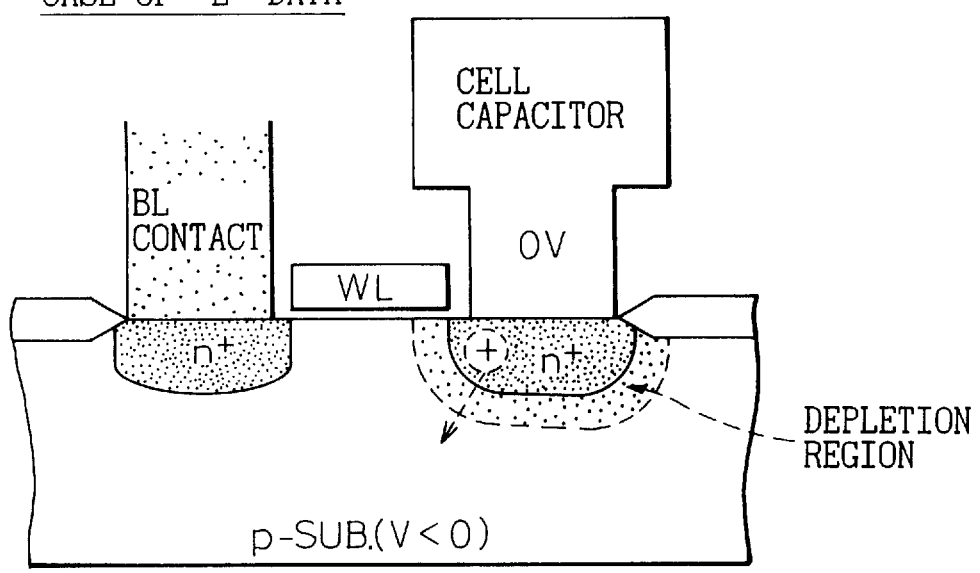

FIGS. 15a and 15b are diagrams showing models of cell structures. A transistor in a cell is formed on a p-type semiconductor substrate (p-SUB), and n-type diffused regions are formed as a source and drain of the transistor. A p-type semiconductor region below a channel in the transistor is biased negatively to 0 V or smaller. Moreover, a capacitor in the cell is brought into contact with one of the n-type diffused regions serving as the source and drain, and a bit line (BL) is brought into contact with the other thereof.

Herein, as far as the n-type diffused region with which the capacitor is brought into contact is concerned, a larger negative bias is applied to a pn junction when charge inducing a high-level signal is accumulated (FIG. 15a) than when charge inducing a low-level signal is accumulated (FIG. 15b). In other words, the width of the depletion layer on the pn junction in the cell structure shown in FIG. 15a (high-level data is accumulated) is larger. In this case, a reverse current (that is, a leakage current) gets larger than the one given by the expression (3).

The leakage current is very small. However, as time passes, the quantity of accumulated charge is accordingly decreased. With the progress of the trend toward a macroscopic semiconductor integrated circuit a capacitor in a cell and the capacitance thereof become smaller, and a maximum value (VcsMAX) of a high-level signal induced by an accumulated charge decreases. Consequently, a maximum magnitude of the accumulated charge decreases. Under the conditions in which a leakage current is the same, as the capacitance of a cell or the maximum value VcsMAX becomes smaller, the time at which the lower-limit voltage (VcsMIN) is reached.

FIG. 16 shows a practical example of a storage voltage capable of being read as a high-level signal. Herein, the storage voltage is regarded as an effective high-level signal. The ratio of the capacitance of a bit line (Cb1) to the capacitance of a cell (Cs), that is, Cb1/Cs, shall be 5, and the sensitivity of a sense amplifier shall be 50 mV. A minimum voltage permitting a signal representing data to be read and having a level equivalent to the sensitivity of a sense amplifier shall be VcsMIN. VcsMAX denotes a maximum voltage permitting writing of data in a cell or storage of charge therein. A range from the value VcsMAX to the value VcsMIN is a range of storage voltages capable of being read as a high-level signal, that is, a range of effective high levels (arrows 3 and 4 in the drawing). As shown in FIG. 16, as long as the value VcsMAX is the same, the range of effective high levels can be expanded by lowering a precharge voltage vpr (arrow 2 in the drawing). In the present invention, therefore, even decaying data can be read accurately and reliably by lowering the precharge voltage.

Next, the reasons why an expansion of the range of effective high levels leads to an expansion of a margin will be described.

In a DRAM, a signal representing data decays over time because of leakage. The DRAM must be refreshed periodically so that a signal level must be retained at a level equal to or larger than the sensitivity of a sense amplifier. A tolerable range within which a high-level signal can decay is the range of effective high levels shown in FIG. 16. A time interval at intervals of which refresh is carried out can be extended by expanding the range of effective high levels. When charge accumulated in a cell diminishes due to employment of a lower voltage or adoption of microscopic circuitry, the time interval at intervals of which refresh is carried out must be shortened according to the prior art. According to the present invention, the time interval need not be shortened but the range of effective high levels can be expanded.

Under the condition that the potentials at charge accumulation nodes in cells are the same as one another, when a precharge voltage is lower, a difference voltage, to be maintained during reading of data represented by a high-level signal, can be made larger. This leads to more stable reading of data, because a difference potential $\Delta V$ between complementary bit lines attained after reading of data from a cell is provided as the expression (4) and is proportional to a difference between a storage voltage and a precharge voltage used to precharge bit lines.

$$\Delta V = (Vcs - vpr)/[1 + (Cb1/Cs)] \quad (4)$$

where Vcs is the storage voltage in a cell, vpr is the precharge voltage used to precharge bit lines, Cb1 is the capacitance of a bit line, and Cs is the capacitance of the cell.

As mentioned above, a margin enabling an accurate and reliable operation can be maintained even under the condition that a refresh time or a capacitance of a cell is minimum or that a voltage of a signal representing data to be written in a cell is maximum.

The present invention has been described in conjunction with the first to third embodiments. However, the present invention is not limited to these embodiments. For example, the constituent features of the embodiments may be combined properly, and the combinations will readily occur to a person with an ordinary skill in the art though they are not illustrated.

What is claimed is:

1. A dynamic type semiconductor memory device having memory cells, comprising:

complementary bit lines to which said memory cells are connected;

a sense amplifier connected between said complementary bit lines;

dummy cells each connected to at least one of said complementary bit lines and having a charge accumulation node; and a control circuit for controlling the potential at said charge accumulation node, wherein a precharge potential at said complementary bit lines is set to a potential lower than half a potential between the potential at a high-potential power supply and the potential at a low-potential power supply attained when said charge accumulation node is connected to one of said complementary bit lines.

2. The device as set forth in claim 1, wherein said control circuit includes a first switching element for connecting a charge accumulation node in each dummy cell to a first-potential power supply and a second switching element for connecting the charge accumulation node in the dummy cell to a second-potential power supply, and either of said first and second switching elements is turned on.

3. The device as set forth in claim 2, wherein said control circuit further includes a driving signal source for controlling selection or non-selection of each dummy cell, and a third switching element for strapping said complementary bit lines in response to a driving signal when a dummy cell is selected with the driving signal.

4. The device as set forth in claim 3, wherein said dummy cells are selected during a precharge period during which said complementary bit lines are precharged, and left unselected during an activation period during which said sense amplifier is activated.

5. The device as set forth in claim 2, further comprising a fourth switching element for strapping said complementary bit lines during a precharge period during which said complementary bit lines are precharged, wherein said fourth switching element is driven with a signal different from the driving signal for use in controlling selection or non-selection of said dummy cells.

6. The device as set forth in claim 5, wherein a charge accumulation node in a dummy cell connected to at least one of a pair of complementary bit lines and a charge accumulation node in a dummy cell connected to at least one of another pair of complementary bit lines are connected to each other via at least one switching element.

7. The device as set forth in claim 3, further comprising a fourth switching element for strapping said complementary bit lines during a precharge period during which said complementary bit lines are precharged, wherein said fourth switching element is driven with a signal different from a driving signal for use in controlling selection or non-selection of said dummy cells.

8. The device as set forth in claim 7, wherein a charge accumulation node in a dummy cell connected to at least one of a pair of complementary bit lines and a charge accumulation node in a dummy cell connected to at least one of another pair of complementary bit lines are connected to each other via at least one switching element.

9. The device as set forth in claim 2, wherein a charge accumulation node in a dummy cell connected to at least one of a pair of complementary bit lines and a charge accumulation node in a dummy cell connected to at least one of another pair of complementary bit lines are connected directly to each other.

10. The device as set forth in claim 3, wherein a charge accumulation node in a dummy cell connected to at least one of a pair of complementary bit lines and a charge accumulation node in a dummy cell connected to at least one of another pair of complementary bit lines are connected directly to each other.

11. The device as set forth in claim 2, wherein said first potential is set to the same potential as the potential at said low-potential power supply, and said second potential is set to a potential lower than an intermediate potential of the potential at said high-potential power supply and the potential at said low-potential power supply.

12. The device as set forth in claim 1, wherein said dummy cells have the same one-transistor and one-capacitor structure as said memory cells.

13. The device as set forth in claim 12, wherein said dummy cells have a structure equivalent to one memory cell.

14. The device as set forth in claim 12, wherein said dummy cells are each structured by connecting two memory cells, and adjoining diffused regions are linked.

15. The device as set forth in claim 12, wherein said dummy cells are each structured by connecting two memory cells, and conductive regions forming charge accumulation nodes relative to capacitors in adjoining cells are linked.

* * * * *